United States Patent
Futatsuyama

(10) Patent No.: US 7,313,009 B2
(45) Date of Patent: *Dec. 25, 2007

(54) PATTERN LAYOUT OF WORD LINE TRANSFER TRANSISTORS IN NAND FLASH MEMORY WHICH EXECUTES SUBBLOCK ERASE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/627,727

(22) Filed: Jan. 26, 2007

(65) Prior Publication Data

US 2007/0121385 A1   May 31, 2007

Related U.S. Application Data

(63) Continuation of application No. 11/407,146, filed on Apr. 20, 2006, now Pat. No. 7,177,173, which is a continuation of application No. 10/947,131, filed on Sep. 23, 2004, now Pat. No. 7,057,915.

(30) Foreign Application Priority Data

Dec. 26, 2003   (JP)   ............................. 2003-433173

(51) Int. Cl.
   *G11C 5/06* (2006.01)
(52) U.S. Cl. .................................. 365/63; 365/230.03
(58) Field of Classification Search ................ 365/63, 365/230.03, 230.06
   See application file for complete search history.

(56) References Cited

U.S. PATENT DOCUMENTS 5,924,004 A * 7/1999 Hsu ........................... 438/622
6,188,611 B1   2/2001   Endoh et al.
6,240,022 B1   5/2001   Sakui et al.
6,507,508 B2   1/2003   Hosono et al.
6,654,281 B2  11/2003   Georgakos et al.
6,839,283 B1   1/2005   Futatsuyama et al.
7,006,383 B2   2/2006   Tanaka
7,177,173 B2 * 2/2007   Futatsuyama ................. 365/63
2006/0007751 A1 1/2006 Tanaka

FOREIGN PATENT DOCUMENTS

JP   11-177071   7/1999
JP   2002-141477  5/2002

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor device includes a memory cell array, first word lines, second word lines and interconnection switching region. The memory cell array includes electrically rewritable nonvolatile memory cells. Each first word line is connected in common to memory cells of a corresponding row. Second word lines correspond to the respective first word lines. The second word lines are formed of a second interconnection of a layer different from that of the first interconnection. An interconnection switching region is provided between the first word lines and the second word lines. The interconnection switching region connect selected portions of the first interconnection and the second interconnection. The interconnection switching region has a multi-layered interconnection structure in which the first word lines cross the second word lines to change at least part of layout positions.

20 Claims, 9 Drawing Sheets

US 7,313,009 B2

PATTERN LAYOUT OF WORD LINE TRANSFER TRANSISTORS IN NAND FLASH MEMORY WHICH EXECUTES SUBBLOCK ERASE

CROSS-REFERENCE TO RELATED APPLICATIONS

This application is a Continuation of U.S. patent application Ser. No. 11/407,146, filed Apr. 20, 2006 now U.S. Pat. No. 7,177,173, which is a Continuation of U.S. patent application Ser. No. 10/947,131, filed Sep. 23, 2004 now U.S. Pat No. 7, 057,915, and is based upon and claims the benefit of priority from prior Japanese Patent Application No. 2003-433173, filed Dec. 26, 2003. The entire contents of these applications are incorporated herein by reference.

BACKGROUND OF THE INVENTION

1. Field of the Invention

The present invention relates to a nonvolatile semiconductor memory device capable of electrically rewriting data and, more particularly, to a pattern layout of transfer transistors that supply a voltage to word lines in a NAND flash memory which executes a subblock erase.

2. Description of the Related Art

EEPROMs are known as semiconductor memories that can electrically rewrite data. Of these EEPROMs, NAND EEPROMs (NAND flash memories) have received a great deal of attention because of its possibility of higher integration degree. A NAND flash memory has NAND cells each of which is formed by serially connecting a plurality of memory cells, i.e., units that store 1-bit data. NAND flash memories are used in memory cards to store, e.g., image data of digital still cameras.

Along with the recent increase in capacity of NAND flash memories, the write unit (page size) and erase unit (block capacity) are also becoming large. Generally, the block capacity of a NAND flash memory corresponds to an integer multiple (size) of the page capacity. When the block capacity increases, the efficiency in erasing or rewriting data in small capacity becomes low. To prevent this, the present applicant has proposed a method (referred to as a subblock erase) of erasing only part of the block capacity (e.g., Jpn. Pat. Appln. KOKAI Publication No. H11-177071).

In the subblock erase, since the block capacity is partially erased, data in small capacity can efficiently be erased or rewritten.

The subblock erase in a NAND flash memory will be described first.

A memory cell of a NAND flash memory has a MOSFET structure in which a floating gate and control gate (word line) are stacked, via an insulating film, on a semiconductor substrate serving as a channel region. A NAND cell is formed by serially connecting a plurality of memory cells while making adjacent memory cells share the source/drain. The source/drain means an impurity region having at least one of the functions of the source and the drain.

FIG. 1 shows the memory cell array of a NAND flash memory and some of its peripheral circuits. One NAND cell 4a of the NAND flash memory includes two select transistors S1 and S2 and memory cells MC0 to MCi. The gates of the select transistors S1 and S2 are connected to select gate lines SGS and SGD, respectively. The current paths of the memory cells MC0 to MCi are connected in series between the select transistors S1 and S2. The control gates of the memory cells MC0 to MCi are connected to word lines WL0 to WLi, respectively. One end of the current path of each of the select transistors S1 is commonly connected to a source line CELSRC. One end of the current path of each of the select transistors S2 is connected to a corresponding one of bit lines BL0 to BLj. The control gates of cell transistors acting as the memory cells MC0 to MCi and the gates of the select transistors S1 and S2 are commonly connected to the control gate lines (word lines WL0 to WLi) and select gate lines SGS and SGD, which are arranged in the row direction of a memory cell array MCA, for each row.

An erase unit means a set 4b of memory cells MC which belong to the NAND cell 4a and are connected to a predetermined number of word lines WL. A set of the memory cells MC0 to MCi connected to all the word lines WL0 to WLi, including the erase units 4b, and the select transistors S1 and S2 will be referred to as a block (NAND cell block) 4 or 4'. That is, each block 4 or 4' includes a plurality of erase units 4b or 4b'.

The word lines WL0 to WLi in the block 4 have transfer transistors (word line transfer transistors) Tr0 to Tri, respectively. The drain of each of the transfer transistors Tr0 to Tri is connected to a corresponding one of the word lines WL0 to WLi so that a voltage is supplied to the word lines WL0 to WLi. The gates of the transfer transistors Tr0 to Tri are commonly connected to a node G. The source of each of the transfer transistors Tr0 to Tri is connected to a corresponding one of word line driving signal lines (driving lines) CG0 to CGi. The word line transfer transistors Tr0 to Tri construct a part of a row decoder.

The remaining blocks (e.g., the block 4') also have the same structure as that of the block 4.

FIG. 2 is a schematic view for explaining voltage application conditions in the erase in the NAND cell 4a. The data erase is executed in the following way. A ground potential is applied to all control gates (word lines WL0 to WLi) in the selected block. All control gates in unselected blocks and the select gate lines SGS and SGD, bit lines BL0 to BLj, and source lines CELSRC in all blocks are set in a floating state. Then, a high erase potential (about 20V) is applied to the well regions of the cells MC0 to MCi. Accordingly, in the cells MC0 to MCi in the selected block, electrons in the floating gates are drained to the well regions so that the erase is executed for one block. At this time, even in all control gates in the unselected blocks and the select gate lines SGS and SGD, bit lines BL0 to BLj, and source lines CELSRC in all blocks, the potential increases almost upto the erase potential due to capacitive coupling (for example, in the select gate line SGS, capacitive coupling occurs between the gate capacitance of the select transistor S1 and the other capacitance of the select gate line SGS against ground potential). The ground potential is supplied to the word line driving signal lines CG0 to CGi. The transfer transistors Tr0 to Tri in the selected block are turned on because a power supply voltage Vdd is applied to the node G. The ground potential is applied from the word line driving signal lines CG0 to CGi to the control gates of the cells MC0 to MCi in the selected block. In the unselected blocks, the transfer transistors are turned off because the ground potential is applied to the node G. The control gates of the cells MC0 to MCi in the unselected blocks are set in the floating state.

FIG. 3 is a schematic view showing voltage application conditions in the subblock erase in the NAND cell 4a. In this example, the memory cells MC0, MC1, MC2, and MC3 are erased. In the subblock erase, in the selected block, the ground potential is applied to the control gates (word lines) of the cells to be erased, and the control gates of cells not to be erased are set in the floating state. All control gates in unselected blocks and the select gate lines, bit lines, and source lines in all blocks are set in the floating state. Then, a high erase potential (about 20V) is applied to the well regions of the cells. Accordingly, in the cells to be erased in the selected block, electrons in the floating gates are drained to the well regions so that the erase is executed for each selected control gate line. At this time, even in all control gates in the unselected blocks and the select gates, bit lines, and source lines in all blocks, the potential increases almost to the erase potential due to capacitive coupling (for example, in the select gate line, capacitive coupling occurs between the gate capacitance of the select transistor and the other capacitance of the select gate line against ground potential). The ground potential is supplied to the word line driving signal lines CG0 to CG3 corresponding to the cells to be erased. To the contrary, the power supply voltage Vdd is supplied to the word line driving signal lines CG4 to CGi corresponding to the cells not to be erased.

The transfer transistors Tr0 to Tri in the selected block are turned on because the power supply voltage Vdd is applied to the node G. The ground potential is applied to the control gates of the cells to be erased in the selected block. The control gates of the cells not to be erased are charged to "Vdd-Vtt" (Vt is the threshold voltage of the word line transfer transistors) and set in the floating state. In the unselected blocks, the transfer transistors are turned off because the ground potential is applied to the node G. The control gates in the unselected blocks are set in the floating state. The breakdown voltage of an element isolation insulating film which isolates the transfer transistors from each other must be determined on the basis of the maximum potential difference between adjacent transistors and, more specifically, a case wherein one of adjacent transistors has a potential of 20V, and the other has a potential of 0V.

As described above, in the unselected block in the erase operation, the floating state (20V) of a word line is sometimes present next to the ground potential of a word line driving signal line. In the subblock erase operation, in addition to the above case, the floating state (20V) of the word line of a cell not to be erased may be present next to the ground potential of a word line driving signal line or the ground potential of the word line of a cell to be erased. A leakage current flows between the junction portions of transistors through the element isolation insulating film between the junction portions in accordance with the potential difference between them. When a junction portion in the floating state (20V) is present next to a junction portion having the ground potential, the potential difference becomes large, and the leakage current also becomes large. When a large leakage current flows, the potential of the node in the floating state, i.e., the potential of the word line not to be erased drops. When the potential drop in the word line connected to the cell not to be erased is large, the potential difference between the well region and the gate of the cell increases, as described above, and the cell is readily erroneously erased. Especially, when the number of junction portions which have the ground potential and are present next to junction portions in the floating state (20V) is large, the potential drop is conspicuous. The leakage current between the junction portions becomes large as the width of the element isolation insulating film becomes narrow. For this reason, when the number of junction portions which have the ground potential and are present next to those in the floating state (20V) is large, the element isolation insulating film must be wide, and the area of the row decoder increases. On the other hand, as the micropatterning technology advances, the pitch of word lines decreases. Then, the width of the row decoder also decreases, and the element isolation insulating film must be narrower. The increase in area of the row decoder goes against the requirement for micropatterning.

FIG. 4 is a plan view showing a conventional pattern layout of word line transfer transistors. In this example, the number of word lines is 32 (WL0, . . . , WL31). Word line transfer transistors Tr0 to Tr31 are arrayed in three lines. The Y direction indicates the direction in which bit lines BL run. The X direction indicates the direction in which word lines WL run. In the pattern layout shown in FIG. 4, a word line transfer transistor connected to a word line is not present next to those connected to adjacent word lines. This pattern layout of word line transfer transistors takes the element isolation breakdown voltage into consideration and is described in, e.g., Jpn. Pat. Appln. KOKAI Publication No. 2002-141477.

FIG. 5 shows the relationship between the word line transfer transistor pattern layout and the potentials of nodes when the subblock erase is executed for cells connected to the word lines WL8, WL9, WL10, and WL11 in the cell 4b shown in FIG. 1. The transfer transistor Tr6 at 20V (floating state), which is connected to the word line WL6 of the cell not to be erased, opposes the transfer transistors Tr8, Tr9, and Tr11 at 0V in three directions, which are connected to the word lines of cells to be erased. The leakage currents between the junction portion of the transfer transistor Tr6 and those of the transfer transistors Tr13 and Tr14 do not greatly affect because the opposing area is small. However, the potential difference between the junction portion of the transfer transistor Tr6 and those of the word line transfer transistors Tr8, Tr9, and Tr11, which are adjacent in the X and Y directions, largely affects the leakage current. In the above-described case, leakage currents flow from the junction portion of the transfer transistor Tr6 to the transfer transistors Tr8, Tr9, and Tr11 in the three directions, as indicated by arrows. Each leakage current to flow through transfer transistors Tr8 and Tr9 is slightly larger than a leakage current the flow through transfer transistor Tr11. For this reason, the potential drop in the word line is maximized. The device breakdown voltage must be designed in consideration of the maximum leakage current. To do this, the width of the element isolation insulating film or the gate length of the transfer transistor must be increased. This leads to an increase in area of the row decoder.

According to an aspect of the present invention, there is provided a semiconductor device comprising a memory cell array in which electrically rewritable nonvolatile memory cells are arranged in row and columns, first word lines arranged in the memory cell array and connected to the memory cells of the respective rows, the first word lines being formed of a first interconnection extended from gate electrodes of the memory cells, second word lines corresponding to the respective first word lines, and formed of a second interconnection which is formed of a layer different from a layer of the first interconnection, and an interconnection switching region provided between the first word lines and the second word lines, the interconnection switching region connecting selected portions of the first interconnection and the second interconnection, the interconnection switching region having a multilayered interconnection structure in which the first word lines cross the second word lines to change at least part of layout positions.

According to another aspect of the present invention, there is provided a semiconductor device comprising a memory cell array in which memory cells are arranged, first word lines connected to the memory cells and formed of a first interconnection extended from gate electrodes of the memory cells, second word lines corresponding to the respective first word lines, and formed of a second interconnection of a layer different from a layer of the first interconnection, and an interconnection switch provided between the first word lines and the second word lines, the interconnection switch having the first interconnection and the second interconnection cross each other, and configured to change arrangement of at least part of the first word lines.

According to still another aspect of the present invention, there is provided a semiconductor device comprising a first region formed of a transistor having a charge-accumulating layer, a first interconnection connected to the transistor having the charge-accumulating layer, a second region formed of a transistor having no charge-accumulating layer, a second interconnection connected to the transistor having no charge-accumulating layer, and an interconnection switch provided between the first region and the second region and configured to change arrangement of at least part of the first interconnection, the interconnection switch having a multi-layered interconnection structure in which first interconnection and second interconnection cross each other.

DETAILED DESCRIPTION OF THE INVENTION

Figure 6:
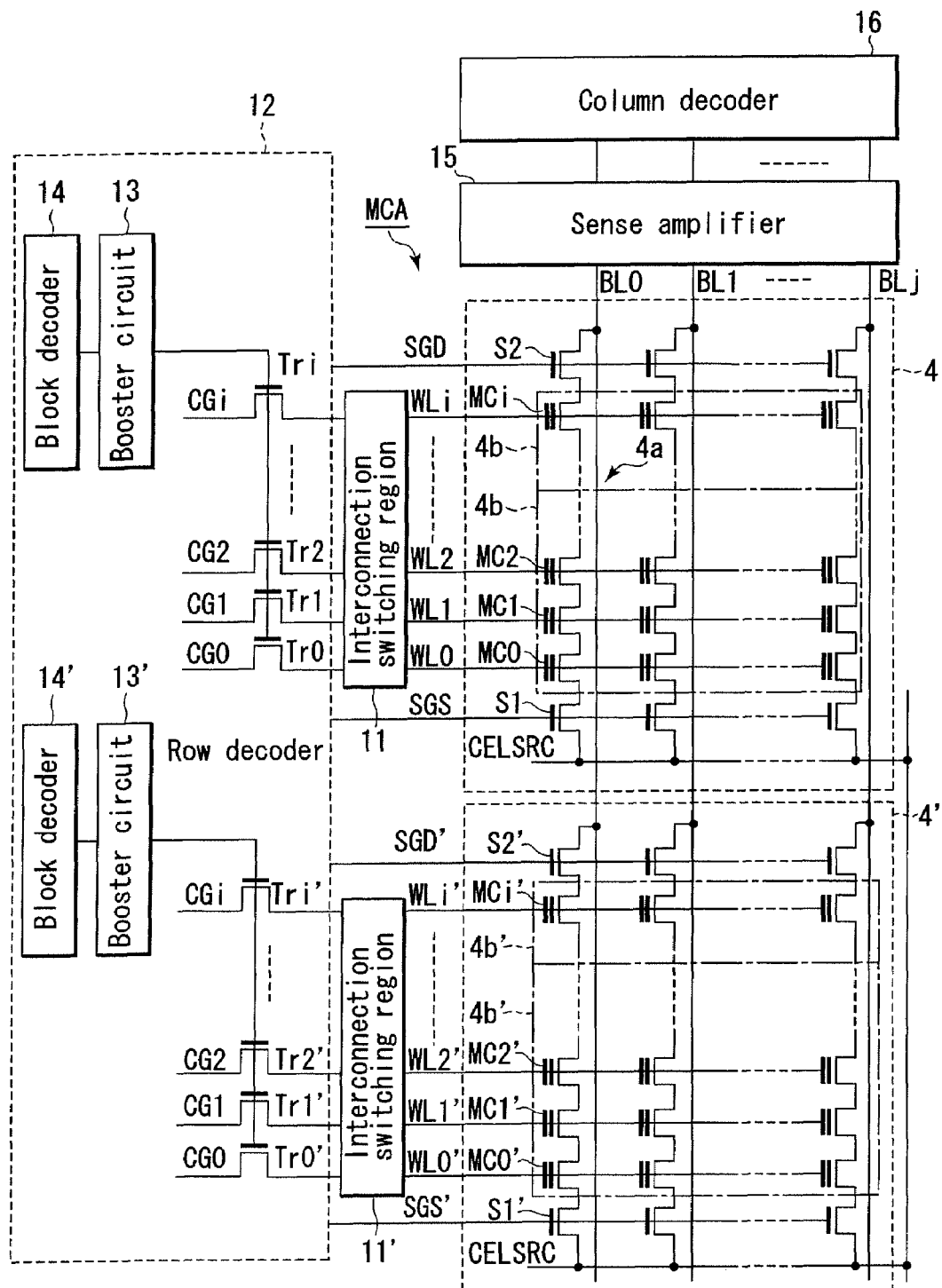
FIG. 6 is a block diagram showing the schematic arrangement of a circuit portion related to a subblock erase in a NAND flash memory so as to explain a nonvolatile semiconductor memory device according to the embodiment of the present invention.
Figure 7:
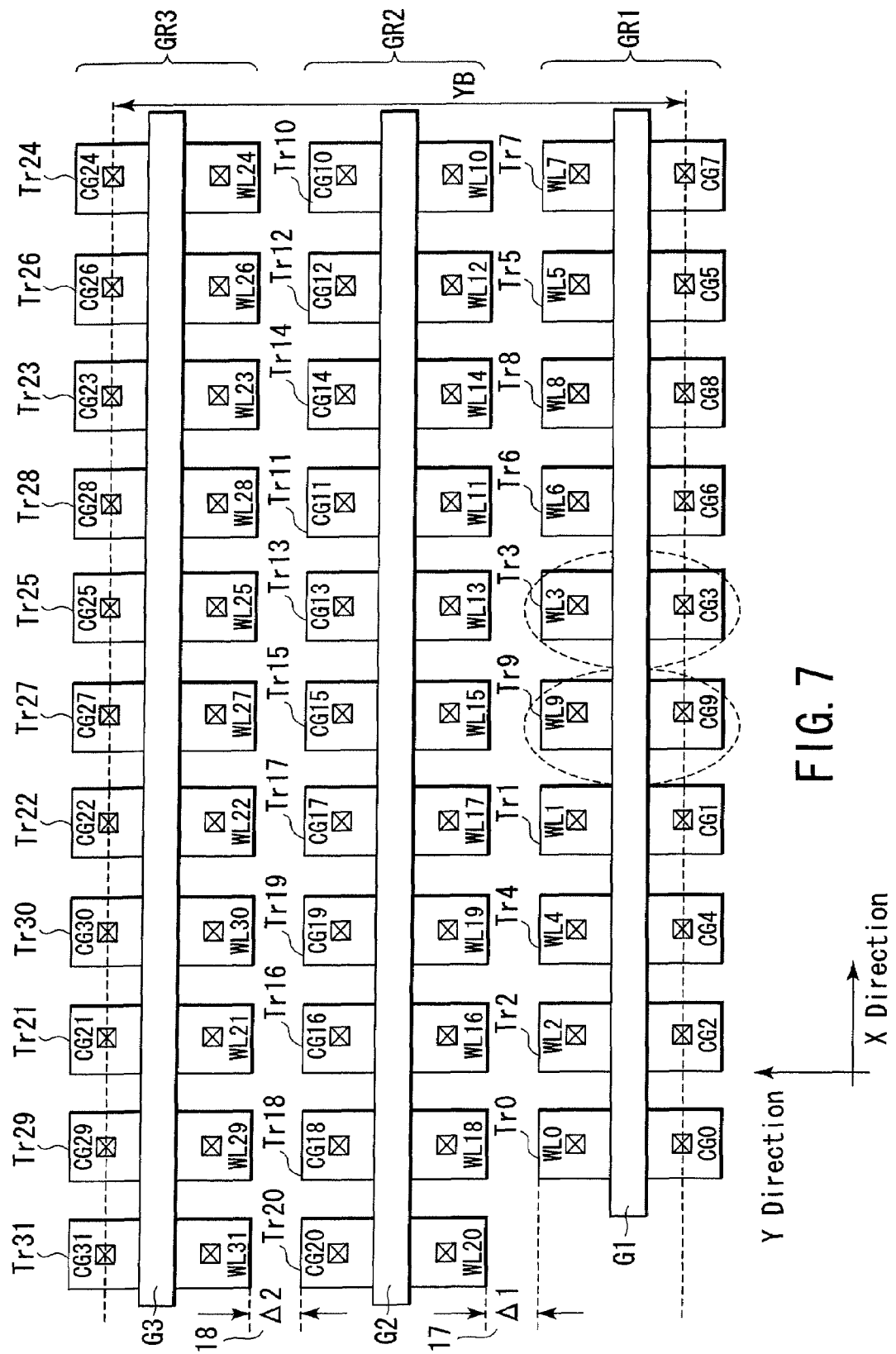
FIG. 7 is a plan view showing the pattern layout of word line transfer transistors in the circuit shown in FIG. 6 so as to explain the nonvolatile semiconductor memory device according to the embodiment of the present invention.
Figure 8:
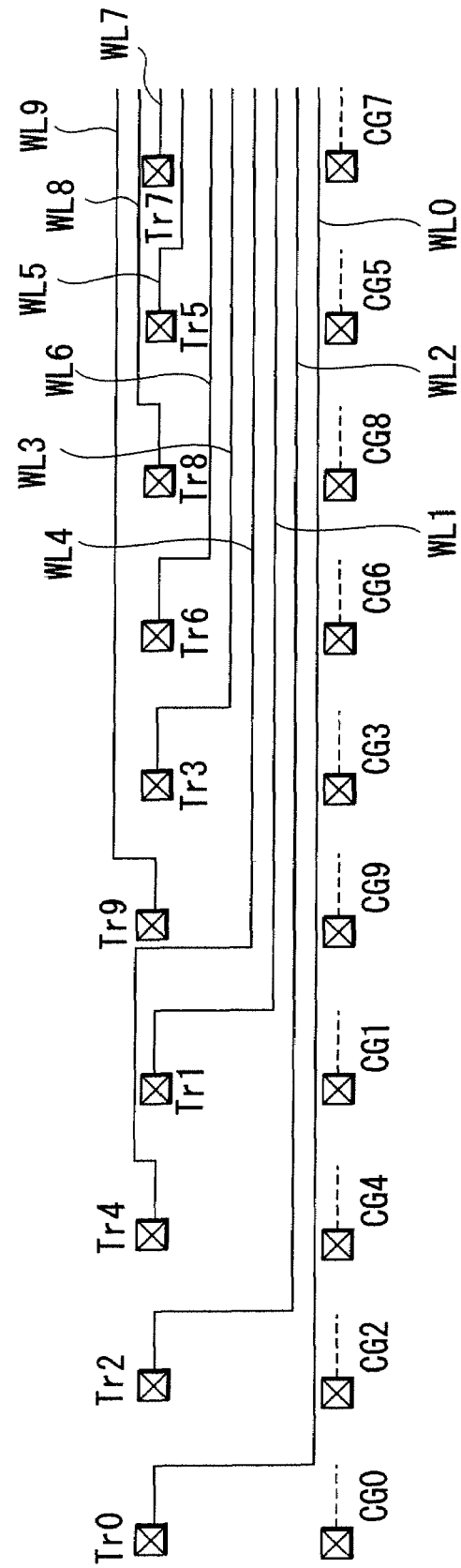
FIG. 8 is a schematic view showing the pattern of word lines connected to the word line transfer transistors in the pattern layout shown in FIG. 7.
Figure 9:
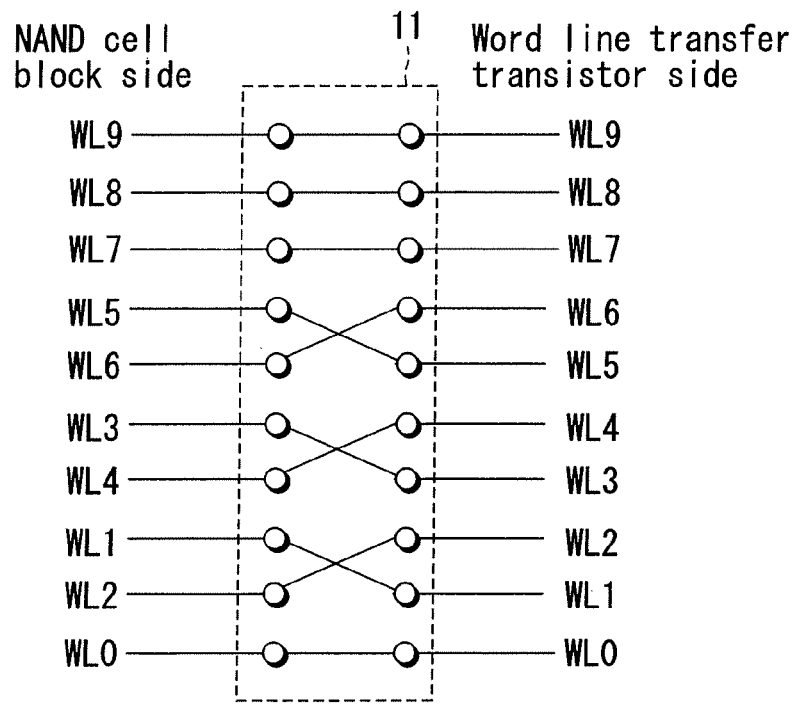
FIG. 9 is a circuit diagram showing an example of the structure of the interconnection switching region between the word lines and the word line driving signal lines in the circuit shown in FIG. 6.
Figure 10:
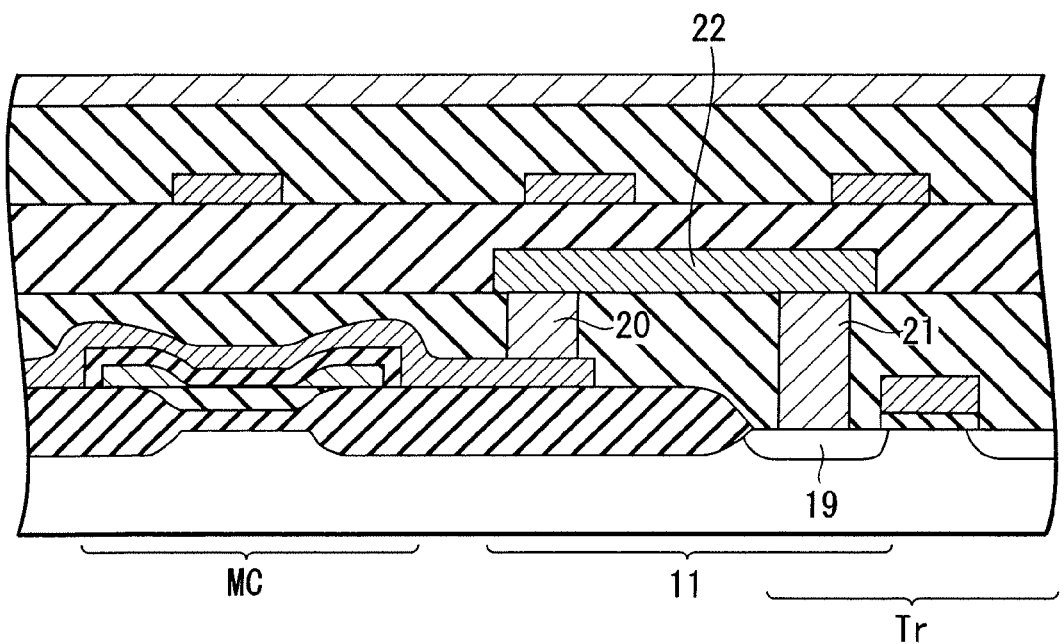
FIG. 10 is a sectional view showing the structure of the interconnection switching region shown in FIGS. 6 and 9.
Figure 11:
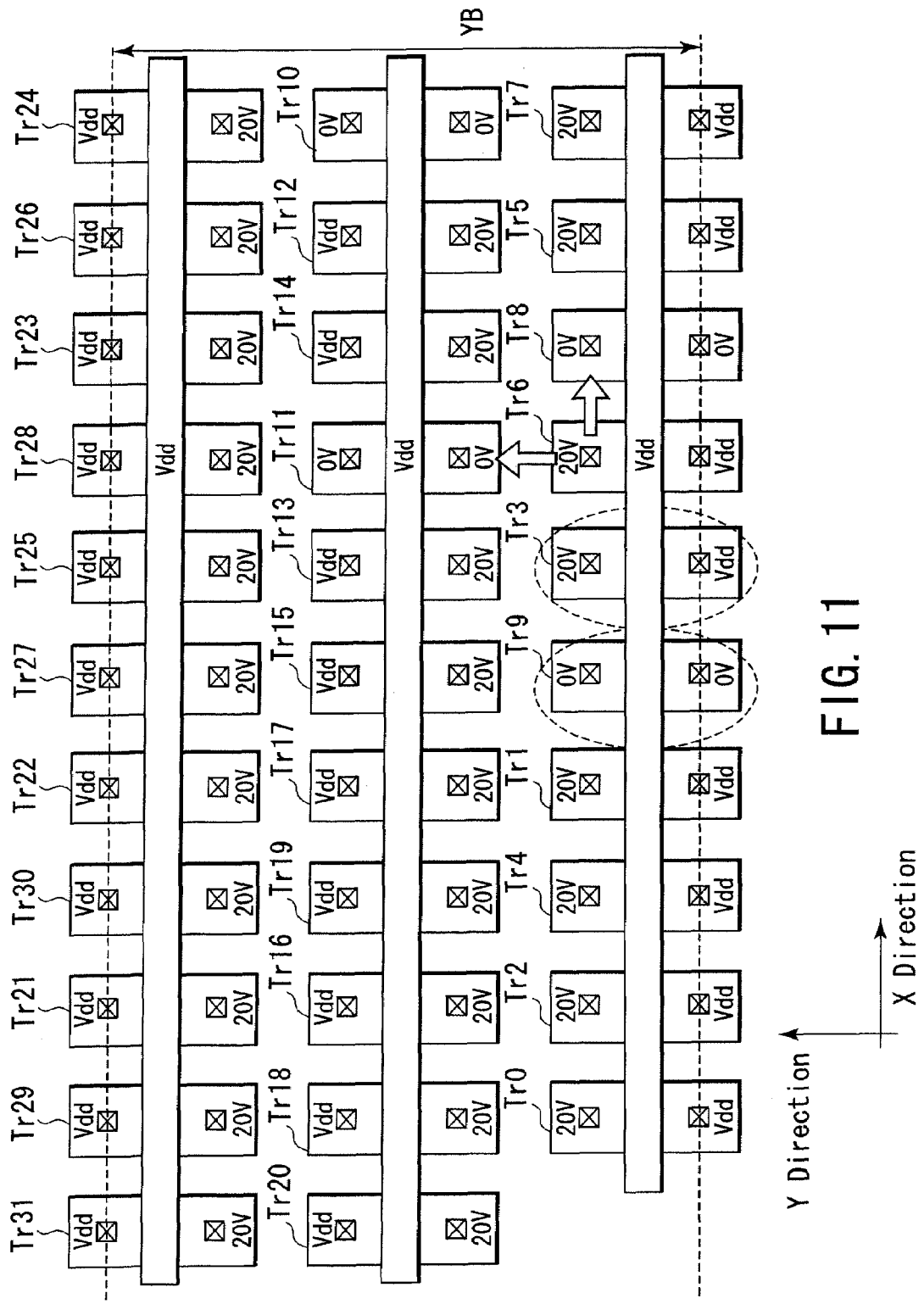
FIG. 11 is a plan view corresponding to FIG. 7, which shows the relationship between the word line transfer transistor pattern layout and the potentials of nodes when the subblock erase is executed.

FIGS. 6 to 11 are views for explaining a nonvolatile semiconductor memory device according to the embodiment of the present invention. A NAND flash memory that executes a subblock erase will be described. FIG. 6 is a block diagram showing the schematic arrangement of a circuit portion related to the subblock erase in the NAND flash memory. FIG. 7 is a plan view showing the pattern layout of word line transfer transistors in the circuit shown in FIG. 6. FIG. 8 schematically shows the pattern of word lines connected to the word line transfer transistors in the pattern layout shown in FIG. 7. FIG. 9 shows an example of the structure of the interconnection switching region of the word lines in the circuit shown in FIG. 6. FIG. 10 shows the sectional structure of the interconnection switching region. FIG. 11 corresponding to FIG. 7 shows the relationship between the word line transfer transistor pattern layout and the potentials of nodes when the subblock erase is executed to erase memory cells connected to word lines WL8, WL9, WL10, and WL11 in a block 4 shown in FIG. 6.

As shown in FIG. 6, a memory cell array MCA has a plurality of blocks 4 and 4'. NAND cells 4a (a plurality of nonvolatile memory cells capable of electrically rewriting data) are arranged in each of the blocks 4 and 4'. One NAND cell 4a includes two select transistors S1 and S2 and memory cells MC0 to MCi. The gates of the select transistors S1 and S2 are connected to select gate lines SGS and SGD, respectively. The current paths of the memory cells MC0 to MCi are connected in series between the select transistors S1 and S2. The gates of the memory cells MC0 to MCi are connected to word lines WL0 to WLi, respectively. One end of the current path of the select transistor S1 is connected to a source line CELSRC. One end of the current path of the select transistor S2 is connected to a bit line BL0. The control gates of cell transistors acting as the memory cells MC0 to MCi and the gates of the select transistors S1 and S2 are commonly connected to the control gate lines (word lines WL0 to WLi) and select gate lines SGS and SGD, which are arranged in the row direction of the memory cell array MCA, for each row.

As in the prior art, an erase unit means a set 4b of memory cells MC which belong to the NAND cell 4a and are connected to a predetermined number of word lines WL. A set of the memory cells MC0 to MCi connected to all the word lines WL0 to WLi, including the erase units 4b, and the select transistors S1 and S2 will be referred to as the block (NAND cell block) 4 or 4'. That is, each block 4 or 4' includes a plurality of erase units 4b or 4b'.

Each of the word lines WL0 to WLi is connected to one end (drain) of the current path of a corresponding one of word line transfer transistors Tr0 to Tri through an interconnection switching region 11. The transfer transistors Tr0 to Tri act as part of a row decoder (second selection circuit or second selection means) 12. The other end (source) of the current path of each of the transfer transistors Tr0 to Tri is connected to a corresponding one of word line driving signal lines (driving lines) CG0 to CGi. The gates of the transfer transistors Tr0 to Tri are commonly connected to the output terminal of a booster circuit 13. The output from a block decoder 14 is supplied to the booster circuit 13. Booster circuit 13 supplies a voltage to gates of word line select transistors in a selected block. This voltage is the level that a word line select transistors can be transfer the voltage to word lines form word line driving signal lines. In addition, this booster circuit 13 supplies the power supply voltage Vdd to a selected block in an erase (subblock erase) mode, 0V is supplied to a unselected block as well. The block decoder 14 decodes an address signal to select the block 4 or 4' in the memory cell array MCA. The booster circuit 13 and block decoder 14 act as a selection circuit (first selection circuit or first selection means) which selects the block 4 or 4' in the memory cell array MCA and supplies a voltage corresponding to an operation.

A sense amplifier 15 is connected to the bit lines BL0 to BLj. Output signals from a column decoder 16 are supplied to the sense amplifier 15. The sense amplifier 15 amplifies data read out from a selected memory cell or supplies data to be written to the memory cell array MCA. The column decoder 16 decodes a column address signal to designate a column of memory cells in the memory cell array MCA.

When i=31, the transfer transistors Tr0 to Tri are divided into a first group GR1, second group GR2, and third group GR3, as shown in FIG. 7. The first group GR1 is constituted by the transfer transistors Tr0 to Tr9 having first impurity regions formed along a first element isolation insulating film 17. The second group GR2 is constituted by the transfer transistors Tr10 to Tr20 having first impurity regions opposing those in the first group GR1 via the first element isolation insulating film 17. The third group GR3 is constituted by the transfer transistors Tr21 to Tr31 having first impurity regions opposing second impurity regions in the second group GR2 via a second element isolation insulating film 18. The first and second element isolation insulating films 17 and 18 are formed along a direction in which gate lines G1, G2, and G3 of the transfer transistors Tr0 to Tr9, Tr10 to Tr20, and Tr21 to Tr31 run. The second element isolation insulating film 18 is wider than the first element isolation insulating film 17 (Δ2>Δ1).

The transfer transistors of the first group GR1 are arranged from the left to the right in an order of Tr0, Tr2, Tr4, Tr1, Tr9, Tr3, Tr6, Tr8, Tr5, and Tr7. The word line driving signal lines CG0, CG2, CG4, CG1, CG9, CG3, CG6, CG8, CG5, and CG7 are connected to the second impurity regions of the transfer transistors Tr0, Tr2, Tr4, Tr1, Tr9, Tr3, Tr6, Tr8, Tr5, and Tr7, respectively. The word lines WL0, WL2, WL4, WL1, WL9, WL3, WL6, WL8, WL5, and WL7 are connected to the first impurity regions.

The transfer transistors of the second group GR2 are arranged from the left to the right in an order of Tr20, Tr18, Tr16, Tr19, Tr17, Tr15, Tr13, Tr11, Tr14, Tr2, and Tr10. The word line driving signal lines CG20, CG18, CG16, CG19, CG17, CG15, CG13, CG11, CG14, CG12, and CG10 are connected to the second impurity regions of the transfer transistors Tr20, Tr18, Tr16, Tr19, Tr17, Tr15, Tr13, Tr11, Tr14, Tr12, and Tr10, respectively. The word lines WL20, WL18, WL16, WL19, WL17, WL15, WL13, WL11, WL14, WL12, and WL10 are connected to the first impurity regions.

The transfer transistors of the third group GR3 are arranged from the left to the right in an order of Tr31, Tr29, Tr21, Tr30, Tr22, Tr27, Tr25, Tr28, Tr23, Tr26, and Tr24. The word line driving signal lines CG31, CG29, CG21, CG30, CG22, CG27, CG25, CG28, CG23, CG26, and CG24 are connected to the second impurity regions of the transfer transistors Tr31, Tr29, Tr21, Tr30, Tr22, Tr27, Tr25, Tr28, Tr23, Tr26, and Tr24, respectively. The word lines WL31, WL29, WL21, WL30, WL22, WL27, WL25, WL28, WL23, WL26, and WL24 are connected to the first impurity regions.

Figure 1:
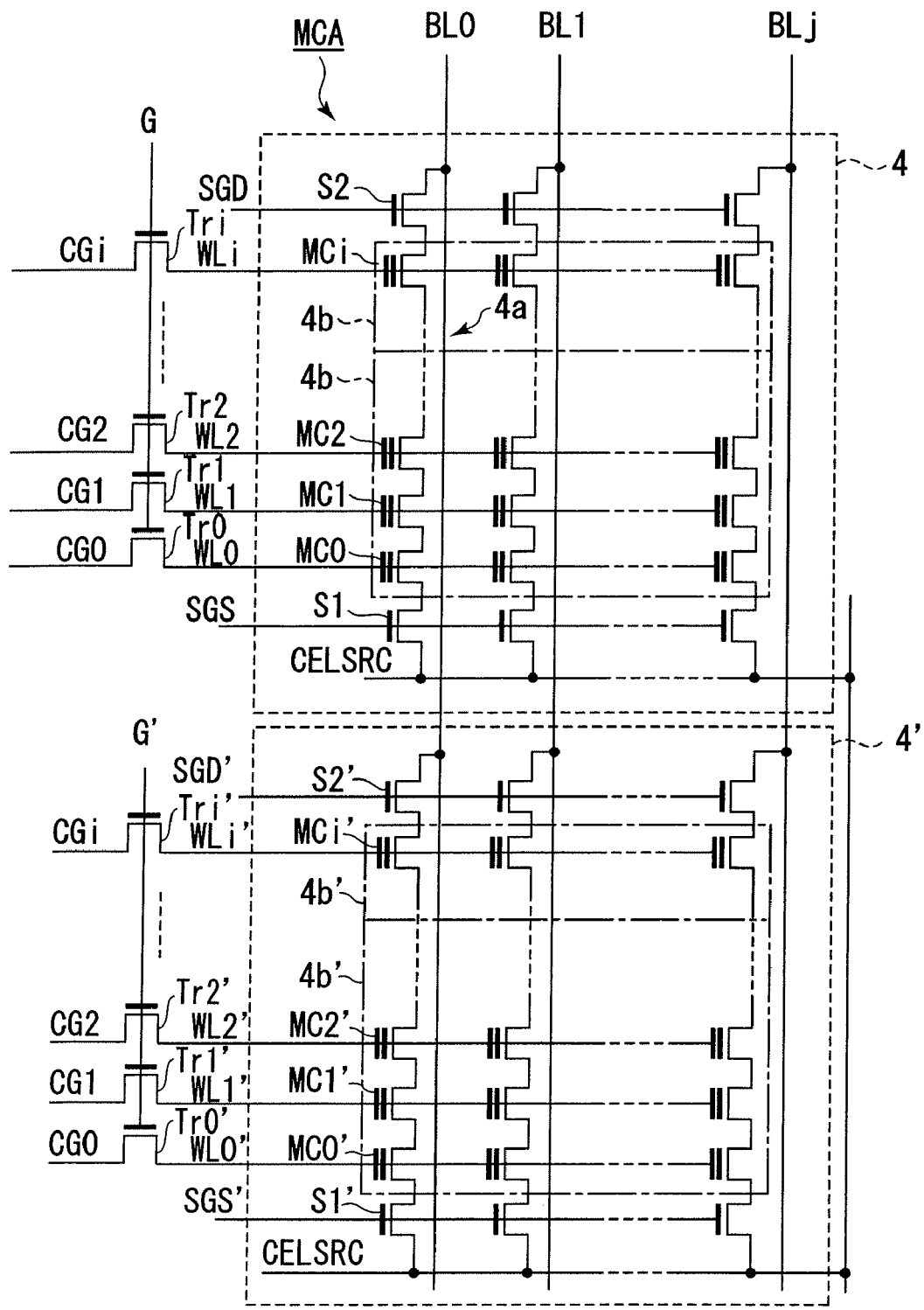
FIG. 1 is a circuit diagram showing the memory cell array of a NAND flash memory and some of its peripheral circuits so as to explain a conventional nonvolatile semiconductor memory device.
Figure 2:
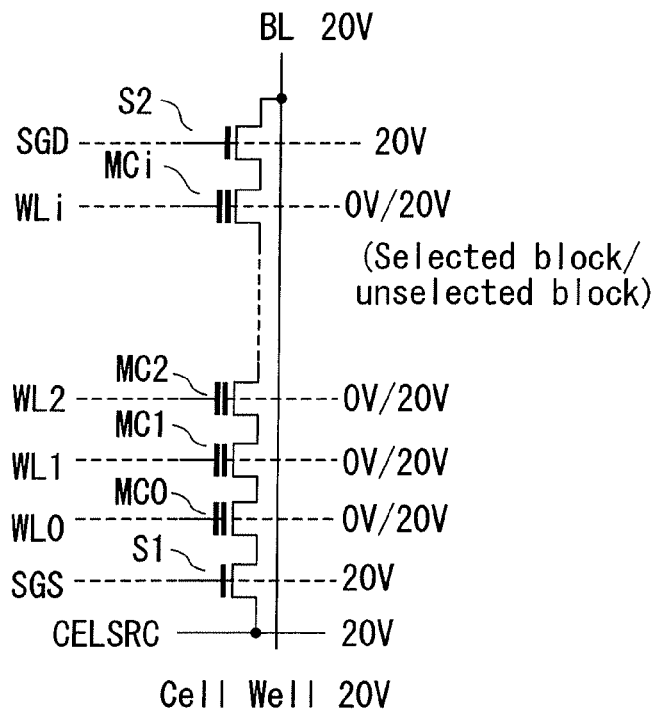
FIG. 2 is a schematic view for explaining voltage application conditions in an erase mode for one NAND cell in the circuit shown in FIG. 1.
Figure 3:
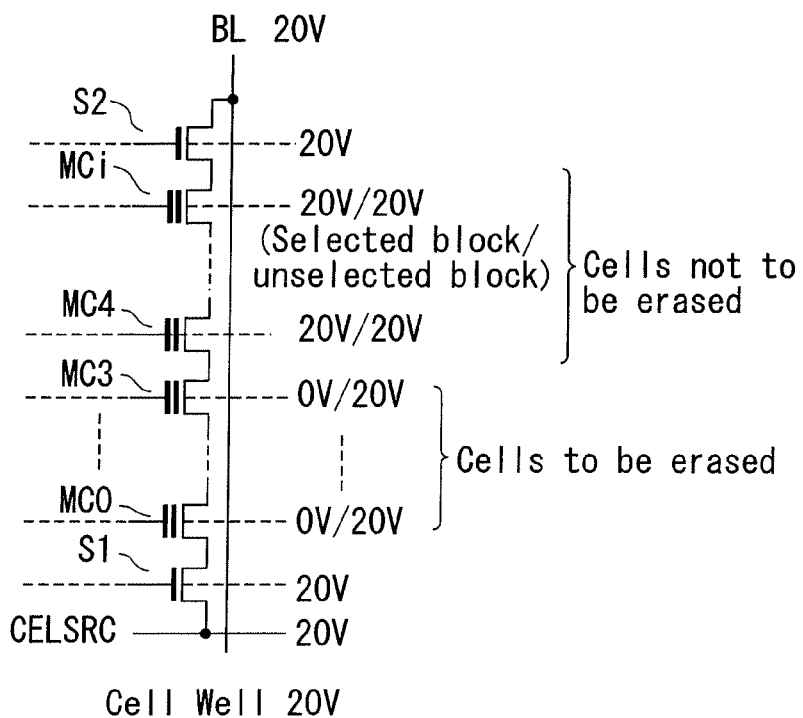
FIG. 3 is a schematic view for explaining voltage application conditions in a subblock erase mode for one NAND cell in the circuit shown in FIG. 1.
Figure 4:
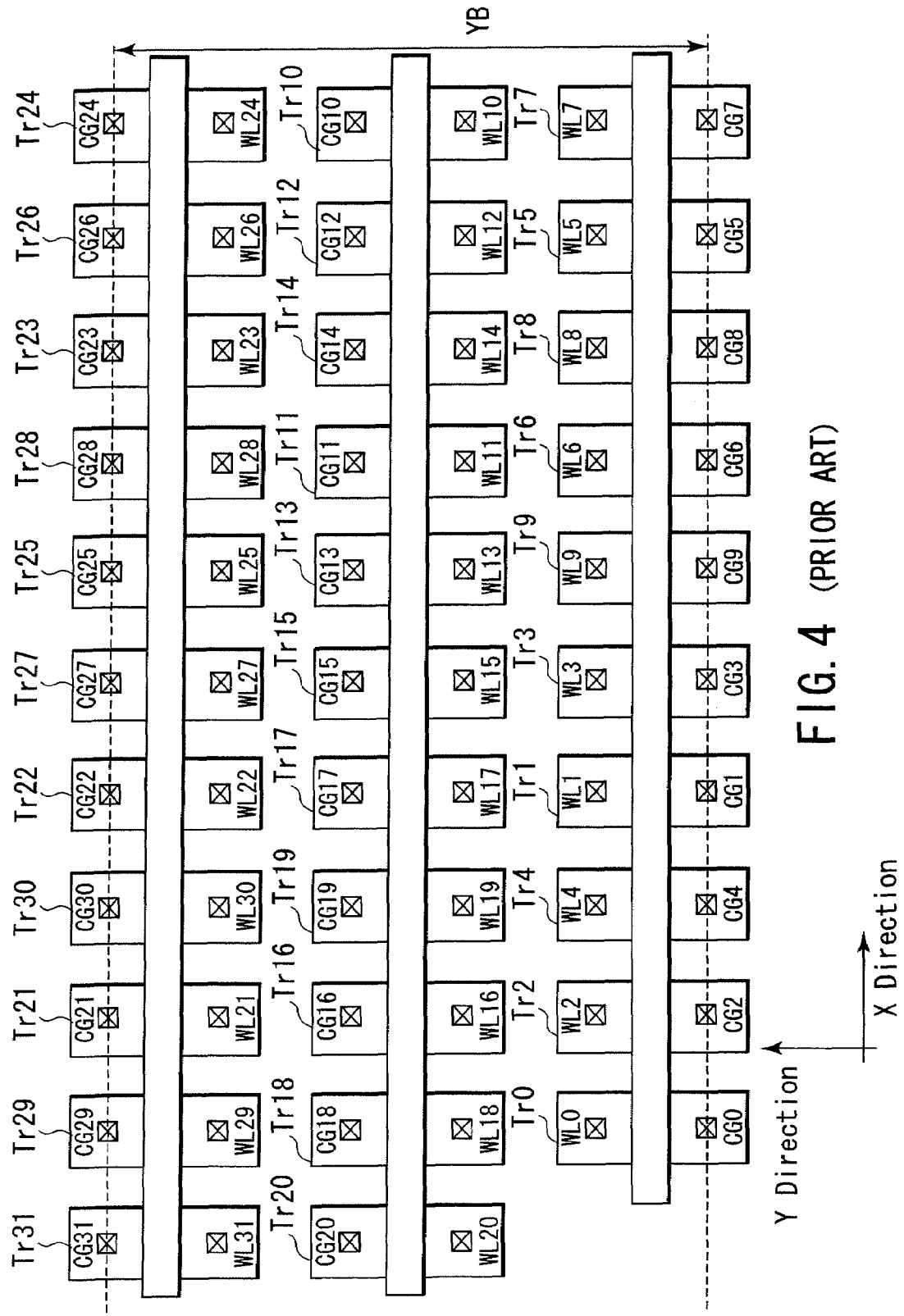
FIG. 4 is a plan view showing a conventional pattern layout of word line transfer transistors.
Figure 5:
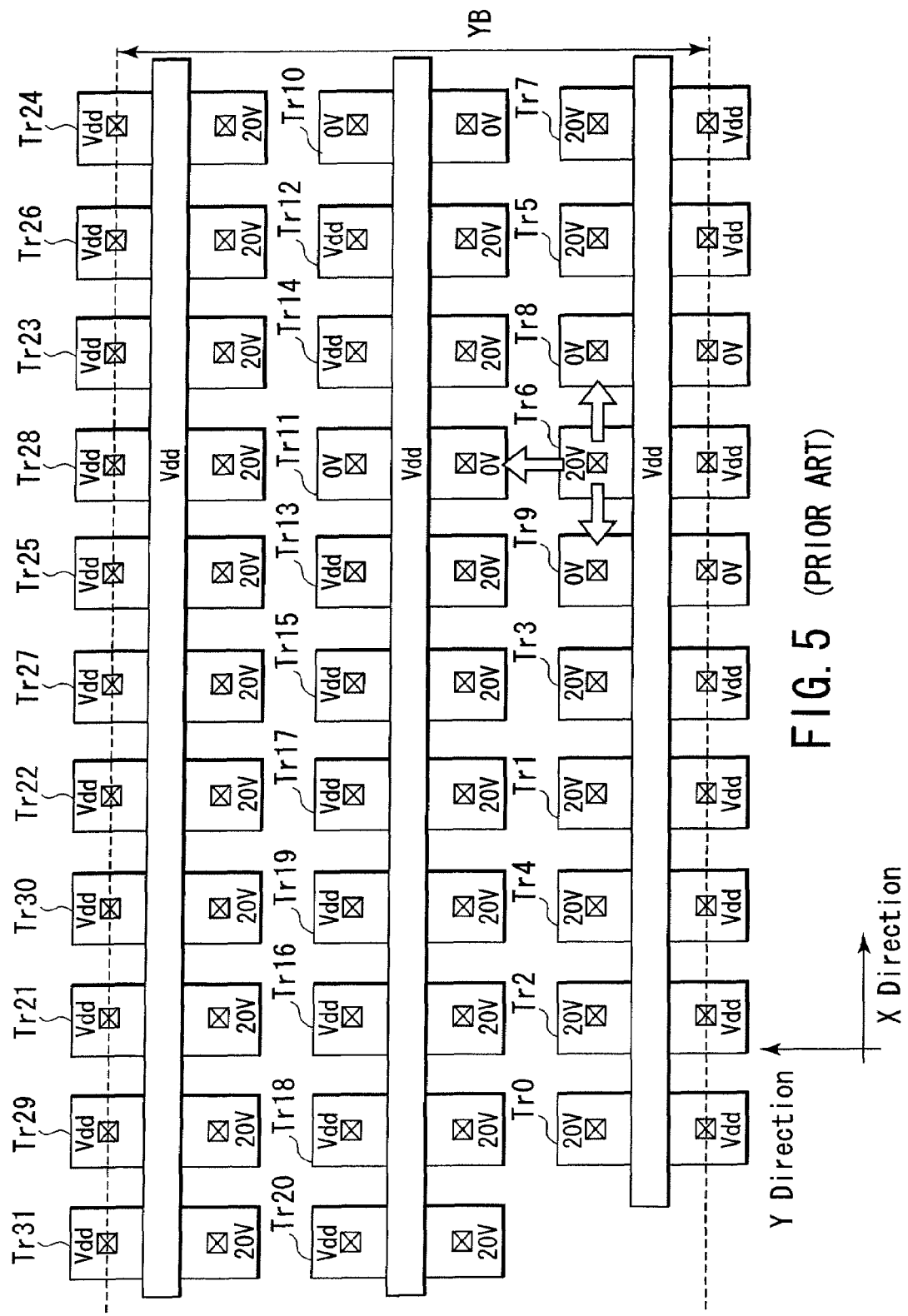
FIG. 5 is a plan view showing the relationship between the word line transfer transistor pattern layout and the potentials of nodes when the subblock erase is executed to erase cells connected to specific word lines in one NAND cell in the circuit shown in FIG. 1.

That is, as compared to the conventional pattern layout (FIGS. 4 and 5), the word line transfer transistors Tr3 and Tr9 indicated by broken lines, which are connected to the word lines WL3 and WL9, change their places.

The word lines WL0 to WL9 having the pattern layout schematically shown in FIG. 8 are arranged on the transfer transistors Tr0 to Tr9. One end of each of the word lines WL0 to WL9 is connected to the first impurity region of a corresponding one of the transfer transistors Tr0 to Tr9. The other end is connected to the interconnection switching region 11. When this pattern layout is used, the detour of interconnections can be reduced. Since the number of interconnections in the passage region of the word lines WL0 to WL9 can be decreased, the interconnection pitch can be relaxed (increased).

The interconnection switching region 11 has a structure shown in FIGS. 9 and 10. As shown in FIG. 9, the word lines WL1 and WL2, the word lines WL3 and WL4, and the word lines WL5 and WL6 cross each other. These word lines WL change their places between the NAND cell side and the word line transfer transistor side. Each cross section is implemented by a multilayered interconnection structure. For example, as shown in FIG. 10, the control gate (word line WL) of the memory cell MC and a first impurity region 19 of the transfer transistor Tr are connected, across the lower interconnection layer, through metal plugs 20 and 21 and an upper metal interconnection layer 22.

FIG. 11 is a schematic view for explaining voltage application conditions in the erase operation of the NAND cell 4a. As shown in FIG. 11, a power supply voltage Vdd is applied to the first impurity regions of the transfer transistors Tr0, Tr2, Tr4, and Tr1. An erase potential of 20V is applied to their second impurity regions. A voltage of 0V is applied to the two ends of the current path of to the transfer transistor Tr9. The power supply voltage Vdd is applied to the first impurity regions of the transfer transistors Tr3 and Tr6. The erase potential of 20V is applied to their second impurity regions. The voltage of 0V is applied to the first and second impurity regions of the transfer transistor Tr8. The power supply voltage Vdd is applied to the first impurity regions of the transfer transistors Tr5 and Tr7. The erase potential of 20V is applied to their second impurity regions.

The power supply voltage Vdd is applied to the first impurity regions of the transfer transistors Tr20, Tr18, Tr16, Tr19, Tr17, Tr15, and Tr13. The erase potential of 20V is applied to their second impurity regions. The voltage of 0V is applied to the first and second impurity regions of the transfer transistor Tr11. The power supply voltage Vdd is applied to the transfer transistors Tr14, Tr12, and Tr10. The erase potential of 20V is applied to their second impurity regions.

The power supply voltage Vdd is applied to the second impurity regions of the transfer transistors Tr31, Tr29, Tr21, Tr30, Tr22, Tr27, Tr25, Tr28, Tr23, Tr26, and Tr24. The erase potential of 20V is applied to their first impurity regions.

When the subblock erase is executed to erase the data in cells connected to the word lines WL8, WL9, WL10, and WL11, the leakage current between the junction portions of the transfer transistor Tr6 connected to the word line WL6 of the cell not to be erased flows in two directions indicated by arrows.

More specifically, when the subblock erase is executed every four word lines (WL(4k), WL(4k+1), WL(4k+2), WL(4k+3): k=0, 1, . . . , 7), the leakage current between the junction portions of a transfer transistor flows in two or less directions in X and Y directions independently of the word line set selected for the erase.

Hence, when the word line transfer transistors Tr0 to Tr31 are laid out in the above-described way, the leakage current between junction portions can be reduced, the potential drop in each unselected word line due to the leakage current between junction portions can be suppressed, and the controllability of the subblock erase can be improved. In addition, the element breakdown voltage of the word line transfer transistor can be easily designed, and the area of the row decoder can be reduced.

In this embodiment, the subblock erase is executed every four word lines (WL(4k), WL(4k+1), WL(4k+2), WL(4k+3): k=0, 1, . . . , 7). However, the number of word lines to be combined for the subblock erase is not limited to four. The same effect as described above can be obtained by appropriately laying out the word line transfer transistors in accordance with the number of word lines selected for the subblock erase.

As described above, according to one aspect of this invention, when the word line transfer transistors are appropriately laid out, the number of leakage current paths between the junction portions of transfer transistors in the subblock erase mode can be decreased to two or less. Accordingly, the leakage current of a word line connected to a memory cell not to be erased can be reduced. Since the controllability of the subblock erase can be improved, any erase error can be prevented. In addition, the element breakdown voltage design and element isolation breakdown voltage design of the word line transfer transistor can be relaxed. Since the size of the word line transfer transistor can be reduced, and the element isolation insulating film can be made narrow, the area of the row decoder can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a memory cell array in which electrically rewritable nonvolatile memory cells are arranged in rows and columns;
first word lines arranged in the memory cell array and connected to the memory cells of respective rows, the first word lines being formed of a first interconnection extended from gate electrodes of the memory cells;
second word lines corresponding to respective first word lines, and formed of a second interconnection which is formed of a layer different from a layer of the first interconnection; and
an interconnection switching region provided between the first word lines and the second word lines, the interconnection switching region connecting selected portions of the first interconnection and the second interconnection, the interconnection switching region having a multilayered interconnection structure in which the first word lines cross the second word lines to change at least part of layout positions.

2. The device according to claim 1, further comprising:
driving lines corresponding to respective second word lines;
transfer transistors selectively connecting one of the second word lines and one the driving lines; and
a selector configured to select memory cells in the memory cell array corresponding to the first word lines in the memory cell array.

3. The device according to claim 2, wherein the interconnection switching region includes a first metal plug electrically connecting the first interconnection to the second interconnection, and a second metal plug electrically connecting the second interconnection to the transfer transistors.

4. The device according to claim 1, wherein the second word lines are included in a layer located above a layer of the first word lines.

5. The device according to claim 1, wherein the second interconnection is an upper layer of the first interconnection.

6. The device according to claim 2, wherein the selector is part of a row decoder.

7. The device according to claim 1, wherein each of the memory cells is a NAND EEPROM cell.

8. A semiconductor device comprising:
a memory cell array in which memory cells are arranged;
first word lines connected to the memory cells and formed of a first interconnection extended from gate electrodes of the memory cells;
second word lines corresponding to respective first word lines, and formed of a second interconnection of a layer different from a layer of the first interconnection; and
an interconnection switch provided between the first word lines and the second word lines, the interconnection switch having the first interconnection and the second interconnection cross each other, and configured to change arrangement of at least part of the first word lines.

9. The device according to claim 8, wherein the memory cell array is divided into a plurality of blocks, the blocks including the memory cells connected to the first word lines.

10. The device according to claim 9, further comprising:
driving lines corresponding to respective second word lines and applying a voltage to the second word lines; and
transfer transistors corresponding to the respective first word lines included in the blocks, and serving as a switch which selects and connects the second word lines and the driving lines corresponding to a desired one of the blocks.

11. The device according to claim 8, wherein the interconnection switch has a multilayered interconnection structure in which the first word lines cross the second word lines.

12. The device according to claim 10, wherein the interconnection switch includes a first metal plug electrically connecting the first interconnection to the second interconnection, and a second metal plug electrically connecting the second interconnection to the transfer transistors.

13. The device according to claim 8, wherein the memory cells are electrically rewritable nonvolatile memory cells.

14. The device according to claim 13, wherein the memory cells are NAND cells.

15. The device according to claim 9, further comprising:
a block decoder which decodes an address signal to select one of the blocks; and
a booster circuit which receives a signal output from the block decoder and applies a voltage to gates of the transfer transistors corresponding to the selected block.

16. The device according to claim 9, wherein the transfer transistors serve as part of a row decoder.

17. A semiconductor device comprising:
a first region formed of a transistor having a charge-accumulating layer;
a first interconnection connected to the transistor having the charge-accumulating layer;
a second region formed of a transistor having no charge-accumulating layer;
a second interconnection connected to the transistor having no charge-accumulating layer; and
an interconnection switch provided between the first region and the second region and configured to change arrangement of at least part of the first interconnection, the interconnection switch having a multilayered interconnection structure in which the first interconnection and second interconnection cross each other.

18. The device according to claim 17, further comprising:
driving lines corresponding to respective portions of the second interconnection and applying a voltage to portions of the first interconnection corresponding to the respective portions of the second interconnection; and
transfer transistors serving as switches which select and connect corresponding portions of the second interconnection and corresponding ones of the driving lines.

19. The device according to claim 18, wherein the interconnection switch includes a first metal plug electrically connecting the first interconnection to the second interconnection, and a second metal plug electrically connecting the second interconnection to the transfer transistors.

20. The device according to claim 17, wherein the first region is a memory cell array including NAND cells, and the first interconnection includes word lines which select the NAND cells.

* * * * *